United States Patent
Nylén

(10) Patent No.: US 8,686,805 B2
(45) Date of Patent: Apr. 1, 2014

(54) OSCILLATOR, A FREQUENCY SYNTHESIZER AND A NETWORK NODE FOR USE IN A TELECOMMUNICATION NETWORK

(75) Inventor: Tomas Nylén, Upplands Väsby (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 24 days.

(21) Appl. No.: 13/498,630

(22) PCT Filed: Sep. 29, 2009

(86) PCT No.: PCT/SE2009/051080
§ 371 (c)(1),
(2), (4) Date: Mar. 28, 2012

(87) PCT Pub. No.: WO2011/040846
PCT Pub. Date: Apr. 7, 2011

(65) Prior Publication Data
US 2012/0188022 A1   Jul. 26, 2012

(51) Int. Cl.
*H03B 5/08* (2006.01)
(52) U.S. Cl.
USPC .............................. 331/167; 331/49; 331/56
(58) Field of Classification Search
USPC ...... 331/34, 36 C, 36 L, 36 R, 46, 48–50, 56, 331/117 FE, 117 R, 167
See application file for complete search history.

(56) References Cited

U.S. PATENT DOCUMENTS

| 4,453,269 A | 6/1984 | Skar |
| 4,749,963 A | 6/1988 | Makimoto et al. |
| 4,939,481 A * | 7/1990 | DaSilva ..................... 331/117 R |
| 5,045,815 A | 9/1991 | Avanic et al. |
| 6,342,820 B1 | 1/2002 | Leyten et al. |
| 6,720,835 B2 * | 4/2004 | Fujita .......................... 331/117 R |
| 7,154,349 B2 * | 12/2006 | Cabanillas ................ 331/117 R |
| 7,432,794 B2 * | 10/2008 | Mattsson ...................... 336/225 |
| 7,629,859 B2 * | 12/2009 | Rai ............................... 331/167 |

(Continued)

FOREIGN PATENT DOCUMENTS

| EP | 0532330 A1 | 3/1993 |
| EP | 0696843 A1 | 2/1996 |
| JP | 2235411 A | 9/1990 |
| WO | 03005559 A1 | 1/2003 |

*Primary Examiner* — Levi Gannon
(74) *Attorney, Agent, or Firm* — Murphy, Bilak & Homiller, PLLC

(57) ABSTRACT

The disclosure relates to an oscillator for use in generating frequencies in a frequency synthesizer, comprising: a first inductor element forming a metal trace loop with at least one turn, and a first capacitive circuit arranged to form a first resonance circuit with the first inductor element and being connected to the first inductor element through at least one first connection terminal, wherein the first capacitive circuit comprises at least one capacitive element and an electrical components arrangement arranged to establish and maintain an oscillation. The oscillator is characterized in that a second capacitive circuit comprising at least one capacitive element and an arrangement of electrical components, is arranged to form a second resonance circuit with the first inductor element and being connected to the first inductor element through at least one second connection terminal located on the opposite side of the first inductor element in respect to the first connection terminal of the first capacitive circuit, wherein the first and second resonance circuits are tuned to substantially the same frequency. The invention also relates to a frequency synthesizer and to a network node for use in a telecommunications network.

12 Claims, 5 Drawing Sheets

(56) References Cited

U.S. PATENT DOCUMENTS

| | | | |
|---|---|---|---|
| 7,633,352 B2 * | 12/2009 | El Rai | 331/181 |
| 8,018,292 B2 * | 9/2011 | Wachi et al. | 331/117 R |
| 2004/0178857 A1 * | 9/2004 | Jacobsson et al. | 331/117 R |
| 2005/0231295 A1 * | 10/2005 | Maeda | 331/117 R |
| 2008/0284534 A1 * | 11/2008 | El Rai | 331/117 FE |
| 2011/0063038 A1 * | 3/2011 | Ainspan et al. | 331/47 |
| 2011/0102093 A1 * | 5/2011 | El Rai et al. | 331/117 FE |
| 2011/0148536 A1 * | 6/2011 | Italia et al. | 331/117 FE |

* cited by examiner

OSCILLATOR, A FREQUENCY SYNTHESIZER AND A NETWORK NODE FOR USE IN A TELECOMMUNICATION NETWORK

TECHNICAL FIELD

The invention relates in general to frequency synthesis and in particular to an oscillator for use in the generation of frequencies. The invention also relates to a frequency synthesizer comprising such an oscillator for performing frequency generation and to a network node, e.g. a base station, for use in a telecommunications network.

BACKGROUND

A frequency synthesizer may generally be described as an electronic system for generating any of a range of frequencies from a reference signal having a particular frequency. Frequency synthesizers may be found in many different kinds of devices, such as, radio transceivers, mobile telephones or cellular phones, radio base stations (RBSs), satellite transceivers, GPS systems, etc.

In for example a mobile radio application, a signal to be used when transmitting and receiving data is conventionally generated by a frequency synthesizer comprising a phase-locked loop (PLL). A PLL frequency synthesizer may for example have a reference signal with a certain frequency as input, and a programmable counter which may generate a comparison signal by dividing an output signal outputted from the PLL frequency synthesizer. The output signal from the PLL frequency synthesizer may be an output signal outputted from an oscillator also comprised in the PLL frequency synthesizer. The PLL frequency synthesizer may further include a phase comparator for comparing the phase of the input reference signal with the phase of the comparison signal from the programmable counter and produce an output signal in dependence of this phase difference. From this output signal, a control signal (e.g. a tuning voltage) may be generated and used as input to the oscillator in order for the oscillator to generate and output an output signal having a specific frequency and specific noise characteristics, that is, the output signal outputted from the PLL synthesizer.

However, when the PLL and the oscillator comprised in the PLL are designed for applications which have high requirements on the noise performance of the output signal as opposed to other applications with low requirements on the noise performance of the output signal, the PLL and the oscillator are designed using different technologies. Examples of applications with high requirements on the noise performance of the output signal are network units or nodes, such as, e.g. base stations (for example, Radio Base Stations (RBSs)). Examples of applications with low requirements on the noise performance of the output signal are terminal units, such as, e.g. mobile telephone applications. The PLL is conventionally designed as an integrated circuit (IC), while the oscillator is designed using discrete electrical components, such as, e.g. resistors, capacitors, inductors, etc. This is inter alia because implementing the oscillator on an integrated circuit would result in that the signal-to-noise ratio of the output signal outputted from the PLL would not fulfil the high requirements on the noise performance of many existing and new emerging applications on the market today.

Using different technologies such as an integrated PLL circuit and a discrete oscillator to form a frequency synthesizer, however, does not enable a compact solution from a miniaturization perspective, as well as it does not provide a particularly cost effective solution from a manufacturing standpoint. These are factors to consider in contemporary design of various telecommunication applications and wireless devices, etc.

SUMMARY

It has been realized by the inventor that it is desirable to achieve a cost effective oscillator with an improved noise performance. In other words, the inventor has realized that it would be advantageous to achieve an oscillator with an improved noise performance.

This has been achieved by an oscillator for use in generating frequencies in a frequency synthesizer, comprising: a first inductor element forming a metal trace loop with at least one turn, and a first capacitive circuit arranged to form a first resonance circuit with the first inductor element and being connected to the first inductor element through at least one first connection terminal, wherein the first capacitive circuit comprises at least one capacitive element and an electrical components arrangement arranged to establish and maintain an oscillation, characterized in that a second capacitive circuit comprising at least one capacitive element and an arrangement of electrical components, is arranged to form a second resonance circuit with the first inductor element and being connected to the first inductor element through at least one second connection terminal located on the opposite side of the first inductor element in respect to the first connection terminal of the first capacitive circuit, wherein the first and second resonance circuits are tuned to substantially the same frequency, i.e. the same or almost the same frequency. In this regard, it should be appreciated by the reader that it is not necessary that the first and second resonance circuits are tuned to exactly the same frequency. There exists some tolerance. Accordingly, it suffices that the first and second resonance circuits are tuned to almost the same frequency in order to achieve the desirable effects.

By having a first and a second capacitive circuit, which are tuned to the same or almost the same frequency (i.e. matched), operate and simultaneously feed the same inductor element from opposite sides creating a first and a second resonance circuit with the same inductor element, the first and the second capacitive circuit can experience a lower inductance from the inductor element as seen from each end. This is because of the fact that the length of the metal trace loop of the inductor element between the terminals of the capacitive circuits and the location of the virtual ground points of the oscillator can be halved for each of the first and second capacitive circuits feeding the inductor element as compared to a single capacitive circuit feeding the same inductor element. It follows from this lowered inductance that the amount of current that may be provided to the first and second resonance circuit may be increased without exceeding the voltage limitations of the first and second capacitive circuits. By increasing the amount of current provided to the first and second resonance circuit, the power supplied to each of the resonance circuits is increased. This can in turn result in an increased improvement in the phase noise performance of the oscillator.

The matched first and second capacitive circuits may be arranged to oscillate out-of-phase. In this out-of-phase mode, the first and second capacitive circuits can experience half of the inductance as compared to other solutions using only a single capacitive circuit together with the inductor element. It follows that twice the amount of current as used in a solution using only the single capacitive circuit may now be fed into each of the first and second capacitive circuits. Thus, the total amount of current that may be supplied to the resonance circuits is four times that of the total amount of current that may be supplied to the resonance circuit of other solutions using only a single capacitive circuit. Since the physical size of the metal trace loop of the inductor element may remain unchanged as compared to other solutions using only a single capacitive circuit, the inductor element may maintain the same Q-value. Thus, by being enabled to feed four times more power into the oscillator without changing the Q-value of the inductor element, the phase noise performance can in this case be improved by 6 dB as compared to other solutions using only a single capacitive circuit.

Another advantage of the above described oscillator is that it enables the first inductor element, the first capacitive circuit and the second capacitive circuit of the oscillator to be formed and manufactured as an integrated circuit, IC, and integrated on the same die. This removes the need and costs of using discrete electrical components when constructing and manufacturing an oscillator. It also advantageously enables the oscillator to be implemented on a single integrated chip with other components so as to, for example, form a highly integrated and cost effective single chip frequency synthesizer. By integrating the oscillator as an IC circuit, numerous advantages can be achieved, such as, reduced costs, added flexibility, etc. It also provides a more robust solution by instead of having several discrete electrical components, each struggling with different performances, limitations and tolerances, etc., having the entire solution provided in a single IC circuit or die. It further makes it easier to build programmable systems by, for example, adding various IC components (such as, a set of capacitive elements in the first and second capacitive circuit) with different values which may enable different selectable frequency bands.

Furthermore, the oscillator may further comprise an inductor element interconnect which may be adapted to provide a electrical connection between a first point on a first side of the first inductor element located between the first and second capacitive circuit with a second point on the other side of the first inductor element located between the first and second capacitive circuit, wherein the first and second points of the first inductor element are located at an substantially equal distance from both the first and second capacitive circuit. By having the inductor element interconnect providing a symmetrical electrical connection across the inductor element, the oscillator is arranged with two stable oscillation modes which enable the oscillator to handle larger frequency ranges and/or reduce the number of capacitive elements needed in the first and second resonance circuits in order to cover the same frequency ranges.

An advantage of having a first and a second capacitive circuit together with an inductor element interconnect as described above, is that the oscillator is enabled to switch between the two stable oscillation modes. The first and second capacitive circuit may namely be arranged to oscillate in-phase or out-of-phase in respect to each other, i.e. phase-locked in an in-phase mode or in an out-of-phase mode. If the first and second capacitive circuits are phase-locked in the in-phase mode, the first and second capacitive circuits are arranged to feed current to the same side of the inductor element at the same time and then simultaneously swing to feed the other side of the inductor element; thus, obtaining an in-phase oscillation. If the first and second capacitive circuits are phase-locked in the out-of-phase mode, the first and second capacitive circuits are arranged to feed current to opposite sides of the inductor element at the same time and then simultaneously swing to feed the other side of the inductor element, respectively; thus, obtaining an out-of-phase oscillation. This allows the oscillator to operate in two different frequency bands (dual mode) in dependence of for which of the two stable oscillation modes the oscillator is currently set. It also results in an increased flexibility and performance of the oscillator, for example, by that it allows the frequency of the oscillator to be changed without losses normally associated thereto, such as, for example, when switching metal insulator metal (MIM) capacitors to the resonance circuit of the oscillator as may commonly be performed.

Another advantage of having a first and a second capacitive circuit together with an inductor element interconnect as described above, is that the amount of variable capacitance needed to cover a given frequency range can be reduced as the frequency range of the oscillator can also be changed by changing the oscillating mode; that is, instead of having to have a certain amount of variable capacitance in the first and second capacitive circuit in order to cover the given frequency range, the oscillator may use the in-phase mode and out-of-phase mode of the first and second resonance circuit and the two resonance frequencies associated thereto in order to cover the given frequency range. In a similar manner, if an increased frequency range of the oscillator is desired, this may be performed in the oscillator by using the dual modes and therefore does not require having to increase the amount of variable capacitance in the first and second capacitive circuits. This is advantageous since the higher the amount of variable capacitance that is used in a capacitive circuit, the more the Q-value of the capacitive circuit degrades. This would consequently have a negative impact on the noise performance of the oscillator. Furthermore, the capacitance of the first and second capacitive circuit may also be arranged to be dynamically controlled. This dynamic control may be performed in various ways, such as, for example, by using switches, such as, CMOS (Complementary Metal-Oxide Semiconductor) transistors.

Additionally, the oscillator may further comprise a second inductor element forming a metal trace loop with at least one turn and being connected to the first capacitive circuit in parallel with the first inductor element, and a third inductor element forming a metal trace loop with at least one turn and being connected to the second capacitive circuit in parallel with the first inductor element. An advantage of having a second and third inductor element as described above is that it further reduces the inductance experienced by the first and second resonance circuits, whereby even higher currents may be provided to the first and second resonance circuits and consequently further improving the noise performance of the oscillator. This is performed without exceeding the voltage limitations of the capacitive circuits in the oscillator.

A further advantage of the oscillator is that it may be used in a frequency synthesizer comprising a phase-locked loop [PLL] for generating frequencies, and the oscillator as described to the above. The frequency synthesizer may also be arranged to form an integrated, single chip frequency synthesizer with the oscillator by having the PLL and the oscillator being integrated on the same die.

A yet further advantage of the oscillator is that it may be used in a network node for use in a telecommunications network. The network node may comprise an oscillator and/or a frequency synthesizer according to the above. The network node may be a mobile base station.

BRIEF DESCRIPTION OF THE DRAWINGS

The objects, advantages and effects as well as features of the invention will be more readily understood from the following detailed description of exemplary embodiments of the invention when read together with the accompanying drawings, in which.

DETAILED DESCRIPTION

Figure 1:
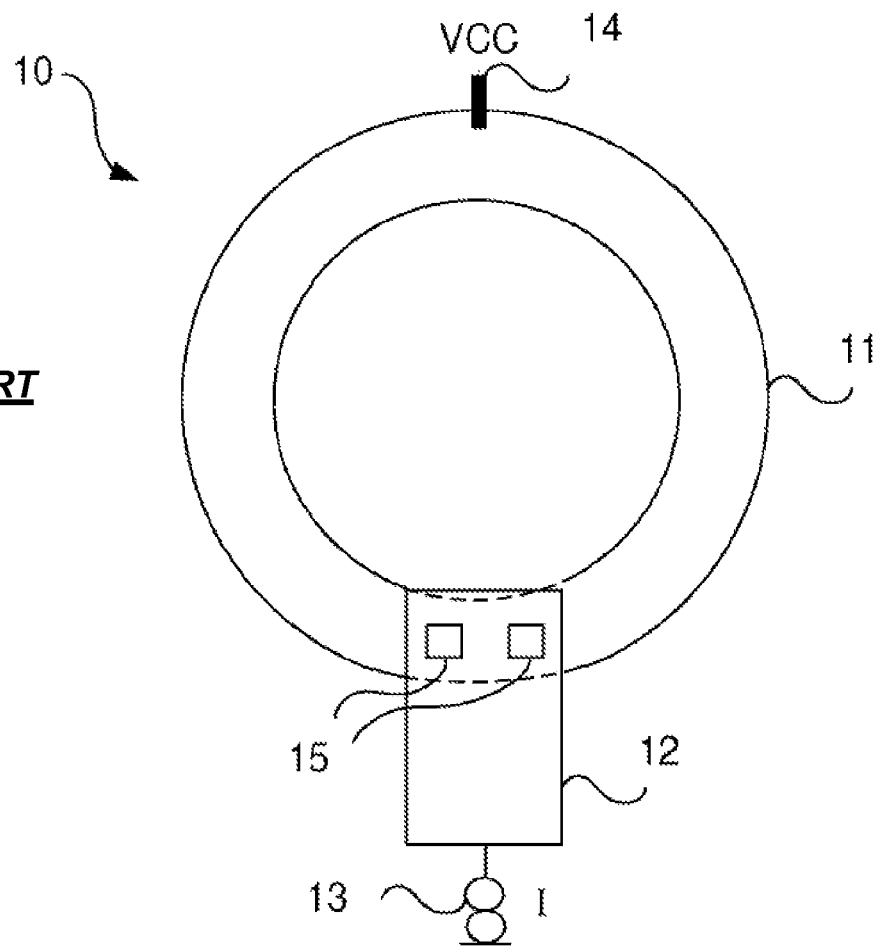
FIG. 1 illustrates an oscillator.

FIG. 1 illustrates a typical voltage controlled oscillator (VCO). A voltage controlled oscillator (VCO) is a frequency-varying oscillation circuit that changes its output frequency according to a tuning voltage (Vtune). The varying range of the frequency is determined according to its specific purposes. A VCO may generate an output signal oscillating at a frequency determined in accordance with the tuning voltage which may be supplied from an external unit. In the case of use in a frequency synthesiser, this tuning voltage may be based on an output signal from a phase detector of a phase locked loop (PLL) as previously described above.

In FIG. 1, the VCO 10 comprises an inductor element 11 and a capacitive circuit 12. The inductor element 11 and the capacitive circuit 12 of the VCO 10 together form a resonance circuit. The capacitive circuit 12 of the VCO 10 may be arranged with tuning voltage terminals (not shown) through which a tuning voltage is arranged to be received, and output terminals (not shown) from which an output from the VCO 10 is arranged to be outputted.

In the VCO 10, the inductor element 11 may be made as a metal trace loop. The metal trace loop of the inductor element 11 comprises one or more turns. In order for the inductor element 11 to be used in an electronic circuit, electrical connection terminals 15 may be connected to the metal trace loop. The inductor value of the inductive element 11 may be determined by physical characteristics, such as, for example, the length, size and shape of the metal trace loop. The inductor value may be scaled down by making the physical size of the metal trace loop smaller. The reason for desiring a small inductor value in the inductor element 11 is because the VCO 10 is often limited to a particular voltage level, whereby the voltage swing must be kept low so as to not destroy the capacitive elements and electrical components of the capacitive circuit 12 which may have limited voltage tolerances. However, if the size of the metal trace loop is made too small, the Q value of the inductor element 11 may degrade. This is because the electromagnetic coupling across the turn(s) of the metal trace loop can become larger when currents travelling in opposite directions come closer to each other. This electromagnetic coupling or counter-action across the metal trace loop can make the inductance value of the inductor element 11 decrease, but the losses can still remain and result in that the Q value of the inductor element 11 may degrade. Thus, there are restrictions and limitations on the size of metal trace loop of the inductor element 11 when trying to achieve an oscillator with an improved noise performance.

The capacitive circuit 12 is connected to the inductor element 11 through the electrical connection terminals 15. The VCO 10 is thus arranged to oscillate at the resonance frequency of the resonance circuit comprising of the inductor element 11 and the capacitive circuit 12 coupled in parallel. This can place a virtual ground at a virtual ground point 14 of the inductor element 11 on the opposite side of from the electrical connection terminals 15 of the capacitive circuit 12. The virtual ground point 14 may here also be arranged to receive a DC supply voltage (VCC). The capacitive circuit 12 normally comprises one or several capacitive elements, such as, for example, variable capacitors (varactors) for shifting the resonant frequency of the resonance circuit according to the tuning voltage, and an electrical components arrangement arranged to establish and maintain the oscillation in the VCO 10. The electrical components arrangement of the capacitive circuit 12 may, for example, comprise a cross-coupled differential pair of NPN-transistors arranged to generate a negative resistance component, and a current source 13 arranged to draw a current I from the NPN-transistors in the capacitive circuit 12

Figure 2:
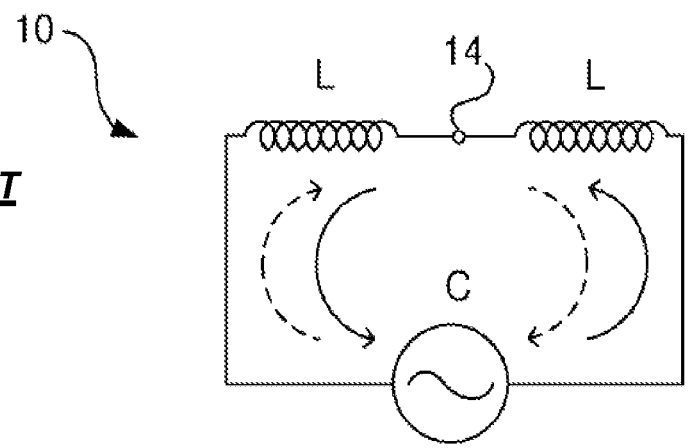
FIG. 2 shows an equivalent electrical circuit representation of the oscillator illustrated in FIG. 1.

FIG. 2 shows a schematic electrical circuit representation of the VCO 10 illustrated in FIG. 1. The inductor element 11 is here represented by the inductors L and the capacitive circuit 12 is represented by a variable capacitor C. The virtual ground point 14 is also shown. As oscillation is established in the resonance circuit, i.e. the LC circuit in FIG. 2, current can flow from a first side of the variable capacitor C through a first one of the inductors L towards the virtual ground point 14 and from the virtual ground point 14 through the second one of the inductors L towards the second side of the variable capacitor C. This is illustrated by the fully drawn arrows in FIG. 2. The inherent properties of the resonance circuit can then cause the direction of the currents to swing, whereby current can flow from the second side of the variable capacitor C through the second one of the inductors L towards the virtual ground point 14 and from the virtual ground point 14 through the first one of the inductors L towards the first side of the variable capacitor C. This is illustrated by the dashed arrows in FIG. 2. Thus, the resonance circuit can store electrical energy by swinging back and forth (oscillating) at its resonant frequency around the virtual ground point 14. The resonance frequency, $f_R$, of the LC circuit in FIG. 2 is determined according to Eq. 1:

$$f_R = \frac{1}{2\pi\sqrt{2 \cdot LC}} \quad \text{(Eq. 1)}$$

Thus, by varying the capacitance of the variable capacitor C, the resonance frequency $f_R$ may be varied. As described above, the VCO 10 may use variable capacitors (varactors) responsive to a received tuning voltage for varying the capacitance of the resonance circuit, and thus shift the resonant frequency $f_R$ of the resonance circuit according to the received tuning voltage.

However, there are drawbacks accompanying the implementation of the above described VCO 10. First, the signal-to-noise ratio of the oscillator output of the VCO 10 does not satisfy the performance requirements of certain telecommunication network applications, such as, for example, the desired signal-to-noise ratio of signals in a mobile radio base station application or a similar network unit or node, when implemented on an integrated circuit (IC). This is because the implementation of the VCO 10 on an integrated circuit (IC) can result in higher losses and a degraded Q value in the inductor element 11 and the capacitive circuit 12 than an implementation using discrete electrical components; and in order to achieve an oscillation with a particular frequency and overcome the resulting losses in the VCO 10, more energy needs to be inputted to the VCO 10. This, however, may result in that the voltage limitations of the capacitive circuit 12 are exceeded, whereby such an implementation is not viable.

This issue may be addressed as previously mentioned by designing the VCO 10 using normal discrete electrical components, such as, i.e. resistors, capacitors, inductors, etc. However, discrete electrical components have set values and thus have to be chosen so as to optimize the VCO 10 for the frequency band that it is to be designed for in order to provide good performance. It follows that the VCO 10 is limited to a particular narrow frequency band. This does not provide a particularly flexible solution, since it results in that changing frequency band of the VCO 10 entails a complete redesign and exchange of the discrete electrical components. It also follows that this solution is not particularly cost effective, since designing (or re-designing), handling and manufacturing electrical circuits using discrete electrical components is an expensive process. It is also not particular beneficial solution from a miniaturization perspective, since discrete electrical components require more physical space than components implemented on an integrated circuit.

According to features of the various embodiments of the invention, these issues can be addressed by having two capacitive circuits that are tuned to substantially the same frequency simultaneously feed the same inductor element from opposite sides. This can create two resonance circuits which may experience a lower inductance, which means that the amount of current that is provided to the two circuits may be increased without having to perform modifications that may result in a degradation of the Q value of the inductor element. This in turn may allow for an increased improvement in the phase noise performance of the oscillator. Advantageous exemplary embodiments of the invention are described in more detail below with reference to FIGS. 3-8. It should also be noted that although only voltage controlled oscillators (VCOs) are referred to in the embodiments below, it is to be understood that other oscillators may use the same features in order to achieve the similar advantages.

Figure 3:
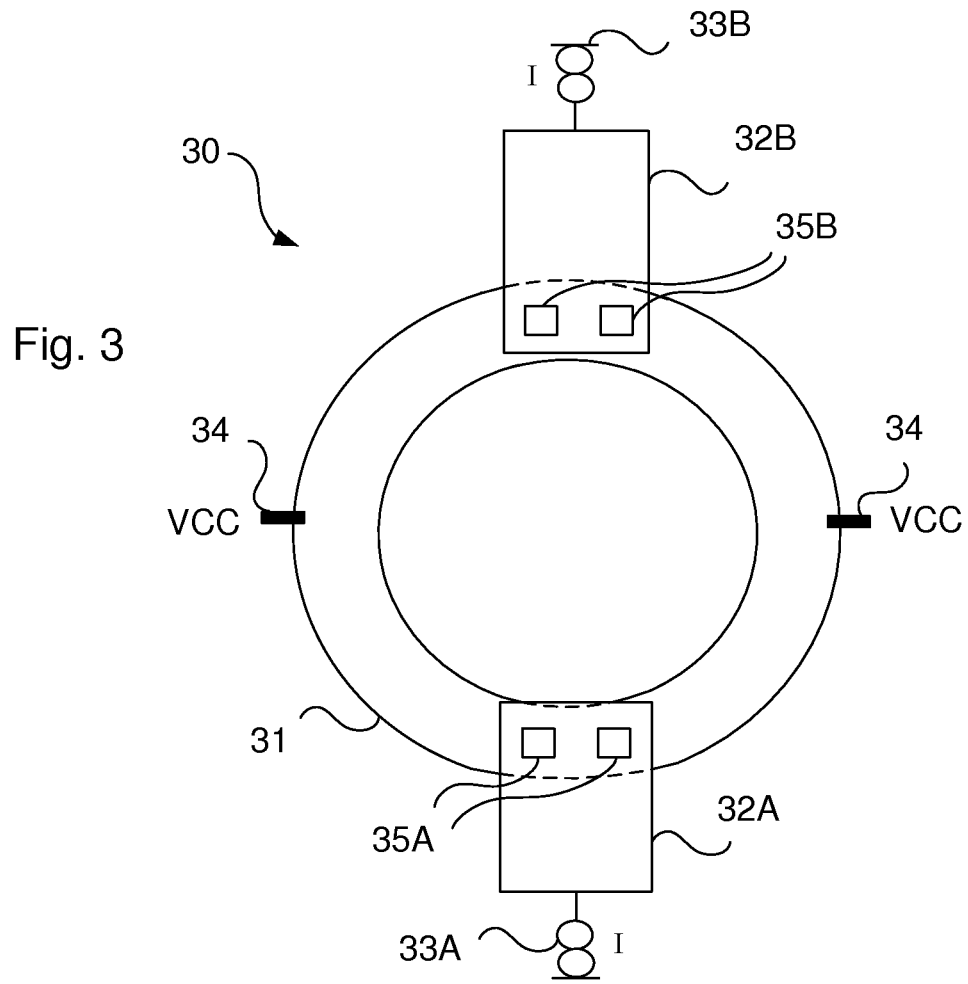
FIG. 3 illustrates an oscillator according to an embodiment of the invention.

FIG. 3 illustrates an oscillator 30 according to an embodiment of the invention. The oscillator 30 comprises an inductor element 31, a first capacitive circuit 32A and a second capacitive circuit 32B. The inductor element 31 may be made as a metal trace loop and may comprise of one or more turns. The inductor element 31 and the first and second capacitive circuits 32A, 32B may comprise electrical connection terminals 35A, 35B that may be arranged to electrically connect the metal trace loop of the inductor element 31 with the first and second capacitive circuits 32A, 32B, respectively. The electrical connection terminals 35B are arranged to connect the second capacitive circuit 32B with the metal trace loop substantially on the opposite side of the inductor element 31 from where the electrical connection terminals 35A are arranged to connect the first capacitive circuit 32A with the metal trace loop. A first resonance circuit is thereby formed by the first capacitive circuit 32A together with the inductor element 31, and a second resonance circuit is formed by the inductor element 31 and the second capacitive circuit 32B.

It should be noted that the inductor element 31 may be of the same physical size and have the same Q value as the inductor element 11 of the VCO 10 as described in reference to FIGS. 1 and 2. Also, the first capacitive circuit 32A and the second capacitive circuit 32B may both be identical or substantially similar to the capacitive circuit 12 of the VCO 10 as described in reference to FIGS. 1 and 2. The first and second capacitive circuit 32A, 32B of the oscillator 30 may also comprise tuning voltage terminals (not shown) which may be arranged to receive a tuning voltage, and output terminals (not shown) from which an output signal at a resonance frequency of the first and second resonance circuits of the oscillator 30 may be outputted.

The first and second capacitive circuits 32A, 32B are both arranged to feed the same metal trace loop of the inductor element 31 from opposite sides. The first and second resonance circuits, that is, the inductor element 31 together with the capacitive circuit 32A and the inductor element 31 together with the capacitive circuit 32B, respectively, are here tuned to substantially the same frequency, i.e. matched to the same resonance frequency. Also, the matched first and second capacitive circuits 32A, 32B are phase-locked so as to feed the metal trace loop of the inductor element 31 out-of-phase from each other. The term out-of-phase may be defined as the first and second capacitive circuits 32A, 32B being arranged to feed current to opposite sides of the inductor element 31 at the same time and then simultaneously swing to feed the other side of the inductor element 31, respectively. This may also place a virtual ground at the virtual ground points 34 of the inductor element 31 which are located across from each other on substantially opposite sides of the metal trace loop of the inductor element 31 and at a substantially equal distance from both of the electrical connection terminals 35A, 35B of the first and second capacitive circuits 32A, 32B. The virtual ground points 34 may here be arranged to receive a DC supply voltage (VCC). As in the following, the advantages of this embodiment may most illustratively be described in reference to the VCO 10 of FIGS. 1-2.

In a general illustrative example which will be referred to below for the sake of clarity, the VCO 10 in FIGS. 1-2 is assumed to have a single-ended inductance L=200 pH. The term single-ended inductance refers here to the inductance of the inductor element 11 as seen from the capacitive circuit 12, that is, the inductance of one side of the inductor element 11 between the virtual ground point 14 and the electrical connection terminals 15 connecting the capacitive circuit 12 with the inductor element 11 (i.e. the inductance of half of the metal trace loop of the inductor element 11). Furthermore, in this general illustrative example, the inductor element 31 of the oscillator 30 is here for the purpose of illustration assumed to be of the same physical size and have the same Q value as the inductor element 11 of the VCO 10 in FIGS. 1-2.

The matched first and second capacitive circuits 32A, 32B of the oscillator 30 are set to oscillate out-of-phase as described above. It follows that each of the first and second capacitive circuits 32A, 32B can see only half of the inductance of the inductor element 31 single-ended as compared to the capacitive circuit 12 of the inductor element 11 in the VCO 10 in FIG. 1 (that is, in reference to the general illustrative example, $L_A=\{L/2\}=100$ pH in FIG. 4). The single-ended inductance is here the inductance of one side of the inductor element 31 between the virtual ground points 34 and the electrical connection terminals 35A, 35B connecting the capacitive circuits 32A, 32B with the inductor element 31 (i.e. the inductance of a quarter of the metal trace loop of the inductor element 31). This means that the current sources 33A, 33B may be arranged to draw twice as high currents (2×I) from each of the first and second capacitive circuits 32A, 32B (i.e. from the first and second resonance circuits) as compared to the current source 13 in the VCO 10 in FIGS. 1-2, without having to increase the voltage and thus possibly risk destroying or burning the capacitive elements and electrical components of the first and second capacitive circuits 32A, 32B by exceeding their voltage limitations.

Consequently, as there are two capacitive circuits 32A, 32B that may be drawn with twice as high currents (2×I) as in the VCO 10 in FIGS. 1-2, the total amount of current that may be drawn from the oscillator 30 is four times higher than that of the VCO 10 in FIGS. 1-2, that is, 4×I. If the inductor element 31 of the oscillator 30 in FIG. 3 is here assumed to be the same as the inductor element 11 in the VCO 10 in FIGS. 1-2, the physical size of the metal trace loop of the inductor element 31 of the oscillator 30 in FIG. 3 is the same as for the inductor element 11 in the VCO 10 in FIGS. 1-2. This means that the inductor element 31 also may have the same Q value as the inductor element 11 in the VCO 10. Thus, it follows that four times more power is now fed into the oscillator 30 in FIG. 3 than into the VCO 10 in FIGS. 1-2 without having a degradation of the Q value of the inductor element 31 or exceeding the voltage limitations of the first and second capacitive circuits 32A, 32B. This results in 6 dB improved phase noise in the output signal by the oscillator 30 as compared to the VCO 10 in FIGS. 1-2. It should be noted that exactly 6 dB improved phase noise is achieved in the oscillator 30 when the first and second capacitive circuits 32A, 32B are tuned to exactly the same frequency. The term substantially tuned to the same frequency is here used to denote that even though the first and second capacitive circuits 32A, 32B have to be tuned to the same frequency, the frequencies to which the first and second capacitive circuits 32A, 32B are tuned may not be exactly the same in reality. In case the frequencies to which the first and second capacitive circuits 32A, 32B are tuned are not exactly the same, the improved phase noise achieved in the oscillator 30 may not be exactly 6 dB.

Figure 4:
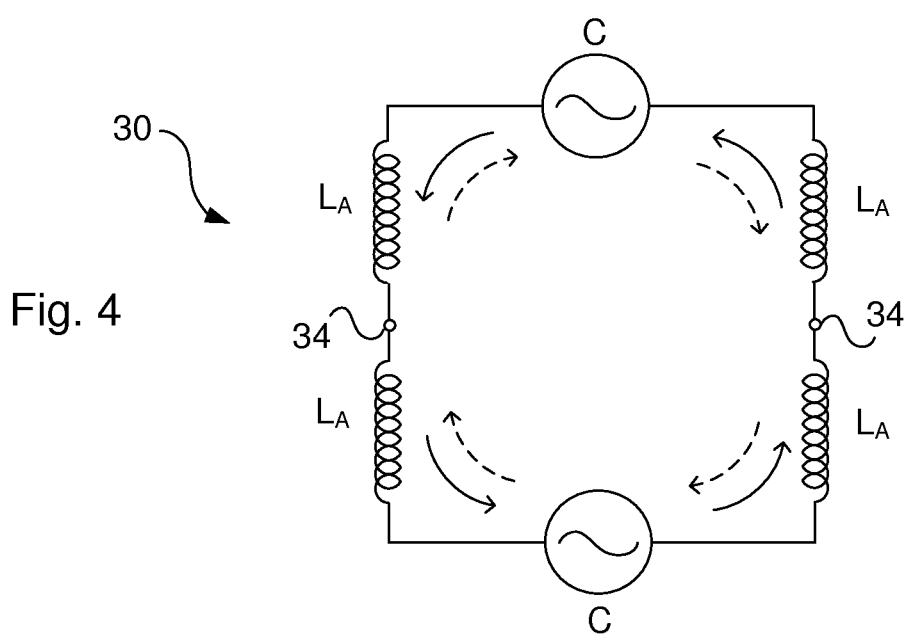
FIG. 4 shows an equivalent electrical circuit representation of the oscillator according to the embodiment of the invention illustrated in FIG. 3.

FIG. 4 shows an equivalent electrical circuit representation of the oscillator 30 according to the embodiment of the invention described in reference to FIG. 3. The inductor element 31 is here represented by the inductors $L_A$ and the first and second capacitive circuits 32A, 32B are represented by variable capacitors C. The virtual ground points 34 are also shown. The inductor value of inductors $L_A$ can be half of the inductor value of the inductor L shown in FIG. 2 (that is, in reference to the general illustrative example, $L_A$=L/2=100 pH).

The fully drawn and dashed arrows in FIG. 4 illustrate the direction of the flow of the currents in the oscillator 30 as the resonance circuits are supplied with power. As a first current flow from a first one of the variable capacitors C through one of the inductors $L_A$ on the right side of the electrical circuit, a second current can simultaneously flow from the second one of the variable capacitors C through one of the inductors $L_A$ on the left side of the electrical circuit. The currents can flow past the virtual ground points 34, through a second one of the inductors $L_A$ and towards the opposite variable capacitor C. This is illustrated by the fully drawn arrows in FIG. 4. The inherent properties of the resonance circuits can then cause the direction of the currents to swing, whereby currents can flow back in the opposite direction through the second one of the inductors $L_A$, past the virtual ground points 34, and through the first one of the inductors $L_A$ back to the variable capacitors C. This is illustrated by the dashed arrows in FIG. 4. Thus, the equivalent electrical circuit representation of the oscillator 30 illustrates how the current can swing back and forth (oscillating) at the resonant frequency around the virtual ground points 34, and also illustrates the out-of-phase oscillation of the variable capacitors C, i.e. the first and second capacitive circuits 32A, 32B in FIG. 3, feeding opposite sides of the electrical circuit at the same time in the oscillator 30.

Figure 5:
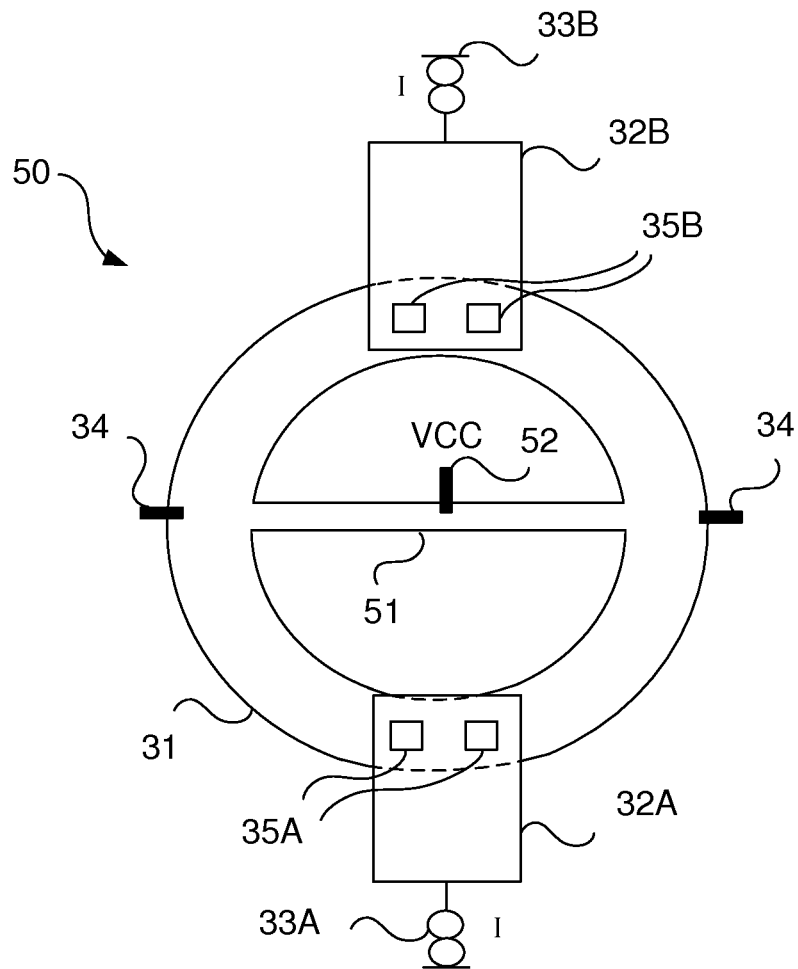
FIG. 5 illustrates an oscillator according to another embodiment of the invention.

FIG. 5 illustrates an oscillator 50 according to another embodiment of the invention. The oscillator 50 may comprise substantially the same elements as the oscillator 30 of the embodiment described in reference to FIGS. 3-4. However, the oscillator 50 additionally comprises an inductor element interconnect 51 and an in-phase virtual ground point 52. The inductor element interconnect 51 is located between a first point on a first side of the metal trace loop of the inductor element 31 and a second point on the other side of the metal trace loop of the inductor element 31. The first and second points are located on the inductor element 31 between the electrical connection terminals 35A, 35B of the first and second capacitive circuits 32A, 32B. The first and second points are furthermore located at a substantially equal distance from both the electrical connection terminals 35A of the first capacitive circuit 32A and the electrical connection terminals 35B of the second capacitive circuit 32B. The inductor element interconnect 51 is arranged to provide an electrical connection across the metal trace loop of the inductor element 31. In this embodiment, the in-phase virtual ground point 52 is here arranged to receive a DC supply voltage (VCC) instead of the virtual ground points 34 as in the previous embodiment, although the virtual ground points 34 may be arranged to receive a DC supply voltage (VCC) if the oscillator 30 operates in the out-of-phase mode described below.

The inductor element interconnect 51 provides the oscillator 50 with a dual mode functionality. This dual mode functionality of the oscillator 30 allows the oscillator 50 to operate in one of two stable oscillation modes, an in-phase mode or an out-of-phase mode. If the first and second capacitive circuits 32A, 32B are set to operate in the in-phase mode, the first and second capacitive circuit 32A, 32B are arranged to feed current to the same side of the inductor element 31 at the same time and then simultaneously swing to feed the other side of the inductor element 31; thus achieving an in-phase oscillation in the oscillator 50. However, if the first and second capacitive circuits 32A, 32B are set to operate in the out-of-phase mode, the first and second capacitive circuit 32A, 32B are arranged to feed current to opposite sides of the inductor element 31 at the same time and then simultaneously swing to feed the other side of the inductor element 31, respectively.

These two stable oscillation modes can have two different resonance frequencies, which in turn may be arranged with associated separate frequency ranges. Thus, in addition to the advantages mentioned in the previous embodiment, the oscillator 50 is able to cover a larger total frequency band and/or enable an oscillator 50 in which the amount of variable capacitance which is needed in the first and second capacitive circuits 32A, 32B may be reduced yet still cover the same frequency range in comparison to other oscillators, such as, for example, the VCO 10 in FIGS. 1-2.

According to a first example, the matched first and second capacitive circuits 32A, 32B of the oscillator 50 may be set to oscillate in the out-of-phase mode. In this out-of-phase mode, the first and second resonance circuits of the oscillator 50 can operate in the same manner as described in the previous embodiment. The first and second capacitive circuits 32A, 32B can see half of the inductance (for example, in the reference to the illustrative example, $L_B$=$L_A$={L/2}=100 pH in FIG. 6) of the inductor element 31 single-ended as compared to the capacitive circuit 12 of the inductor element 11 in the VCO 10 in FIGS. 1-2. The single-ended inductance also here being the inductance of one side of the inductor element 31 between the virtual ground points 34 and the electrical connection terminals 35A, 35B connecting the capacitive circuits 32A, 32B with the inductor element 31 (i.e. the inductance of a quarter of the metal trace loop of the inductor element 31).

The inductor element interconnect 51 is not utilized by the first and second resonance circuits in this out-of-phase mode, whereby both the virtual ground points 34 and in-phase virtual ground point 52 may be considered virtual ground.

According to a second example, the matched first and second capacitive circuits 32A, 32B of the oscillator 50 may be set to oscillate in the in-phase mode. In this in-phase mode, the first and second capacitive circuits 32A, 32B can oscillate in-phase as described above. The first and second capacitive circuits 32A, 32B can see a higher inductance single-ended as compared to the first example when the first and second capacitive circuits 32A, 32B are set to oscillate out-of-phase. This is because, in this in-phase mode, the single-ended inductance is not only the inductance of one side of the inductor element 31 between the electrical connection terminals 35A, 35B connecting the capacitive circuits 32A, 32B with the inductor element 31 and the virtual ground points 34 (i.e. the inductance of a quarter of the metal trace loop of the inductor element 31, e.g. in reference to the general illustrative example, $L_B = L_A = \{L/2\} = 100$ pH in FIG. 6), but also twice the inductance of the inductor element interconnect 51 between the virtual ground points 34 and the in-phase virtual ground point 52 located at the centre of the inductor element interconnect 51 (e.g. $L_C$ in FIG. 6). The latter is because both the first and second capacitive circuits 32A, 32B are simultaneously feeding the inductor element interconnect 51 from the same direction.

In both of the first and second example described above, the first and second resonance circuits may prefer to oscillate at the lower of the two resonance frequencies of the in-phase mode and the out-of-phase mode. This is normally the in-phase mode. The further separated in frequency the resonance frequencies of the in-phase and out-of-phase mode are, the more may first and second resonance circuits prefer the lower resonance frequency. If the resonance frequencies of the in-phase mode and the out-of-phase mode are close in separation, the first and second resonance circuits may be substantially equally willing to oscillate in any of the two modes. Thus, the oscillator 50 can be dynamically controlled to oscillate in either of the in-phase or out-of-phase mode. The inductance perceived by the first and second resonance circuits 32A, 32B when having the first and second capacitive circuits 32A, 32B oscillating in-phase is higher than the inductance perceived by the first and second resonance circuits 32A, 32B when having the first and second capacitive circuits 32A, 32B oscillating out-of-phase.

Figure 6:
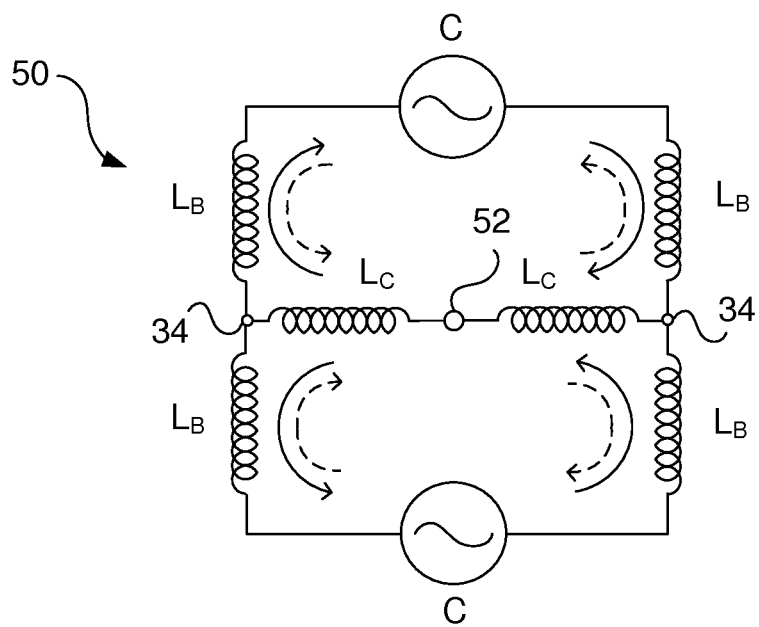
FIG. 6 shows an equivalent electrical circuit representation of the oscillator according to the embodiment of the invention illustrated in FIG. 5.

FIG. 6 shows an equivalent electrical circuit representation of the oscillator 50 according to the embodiment of the invention illustrated in FIG. 5. The inductor element 31 is here represented by the inductors $L_B$ and the first and second capacitive circuits 32A, 32B are represented by variable capacitors C. The inductor element interconnect 51 is here represented by the inductors $L_C$. The in-phase virtual ground point 52 is also shown. The inductor value of inductors $L_B$ can be half of the inductor value of the inductor L shown in FIG. 2, that is, $L_B = L_A = L/2$. The inductor values of the inductors $L_C$ are implementation specific and may be chosen in relation to the inductors $L_B$, e.g. in reference to the general illustrative example, $L_C \approx 0.4 \cdot L_B$.

In the out-of-phase mode, no current will, generally, flow through the inductors $L_C$ since the inductor element interconnect 51 is not utilized in this mode, whereby the single ended inductance as seen by the variable capacitors C may be only $L_B$, that is, in reference to the general illustrative example, $L_B = 100$ pF (such as $L_A$ in FIG. 4). In FIG. 6, the fully drawn and dashed arrows denote the directions of the currents in the in-phase mode described below, and not in the out-of-phase mode. In the out-of-phase mode, the directions of the currents in the oscillator 50 as the resonance circuits are supplied with power may be identical to that described above in relation to FIG. 4 and shown by the fully drawn and dashed arrows in FIG. 4.

In the in-phase mode, however, currents may flow from both variable capacitors C through the inductors $L_B$ on right side of the electrical circuit and then simultaneously through the inductors $L_C$ past the virtual ground point 52 and through the inductors $L_B$ on the left side of the electrical circuit back towards the variable capacitors C, respectively. This is illustrated by the fully drawn arrows in FIG. 6. The inherent properties of the resonance circuits can then cause the direction of the currents to swing, whereby currents can flow from the variable capacitors C back through the inductors $L_B$ on the left side of the electrical circuit, simultaneously through the inductors $L_C$ past the virtual ground point 52, and through the inductors $L_B$ on the right side of the electrical circuit back towards the variable capacitors C, respectively. This is illustrated by the dashed arrows in FIG. 6. This illustrates the in-phase oscillation of the variable capacitors C, i.e. the first and second capacitive circuits 32A, 32B in FIG. 5, feeding the same side of the electrical circuit at the same time in the oscillator 50. The single ended inductance as seen by the variable capacitors C may be $L_B + 2 \cdot L_C$. It follows, in reference to the general illustrative example, that the single ended inductance as seen by the variable capacitors C may be $L_B + 2 \cdot L_C = L_B + 2 \cdot 0.4 \cdot L_B = 180$ pF.

Figure 7:
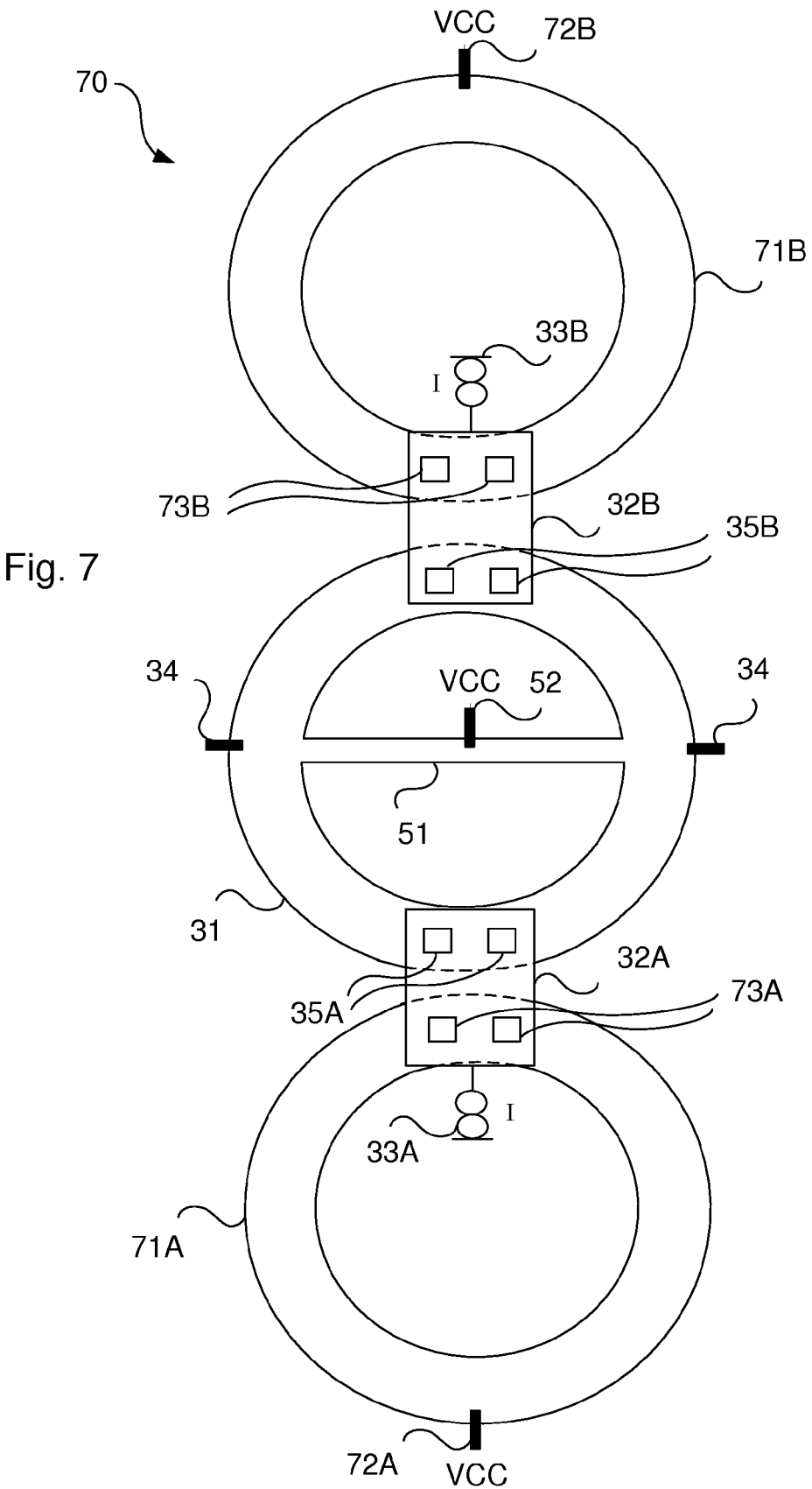
FIG. 7 illustrates an oscillator according to a further embodiment of the invention.

FIG. 7 illustrates an oscillator 70 according to a further embodiment of the invention. The oscillator 70 may comprise substantially the same elements as the oscillator 30 described in the embodiment with reference to FIGS. 3-4 or as the oscillator 50 described in the embodiment with reference to FIGS. 5-6. Additionally, however, the oscillator 70 comprises a second and third inductor element 71A, 71B. The second and third inductor element 71A, 71B may comprise a metal trace loop with at least one turn. The second inductor element 71A may be connected to the first capacitive circuit 32A through electrical connection terminals 73A such that the second inductor element 71A is coupled in parallel with the first inductor element 31. Also, the third inductor element 71B may be connected to the second capacitive circuit 32B through electrical connection terminals 73B such that the third inductor element 71B is coupled in parallel with the first inductor element 31. This may also place a virtual ground at the virtual ground points 72A, 72B of each of the second and third inductor element 71A, 71B on the opposite side from the electrical connection terminals 73A, 73B of the first and second capacitive circuits 32A, 32B, respectively. In this embodiment, the in-phase virtual ground point 52 and the virtual ground points 72A, 72B may here be arranged to receive a DC supply voltage (VCC), although the virtual ground points 34 may also be arranged to receive a DC supply voltage (VCC) if the oscillator 70 operates in the out-of-phase mode as described below.

By having the second and third inductor element 71A, 71B as described above can further reduce the inductance experienced by the first and second resonance circuits 32A, 32B in the oscillator 70. Thus, in addition to the advantages mentioned in the previous embodiments, even higher currents may now be provided to the first and second resonance circuits which may consequently further improve the noise performance; this without exceeding the voltage limitations of the capacitive circuits 32A, 32B in the oscillator 70.

Figure 8:
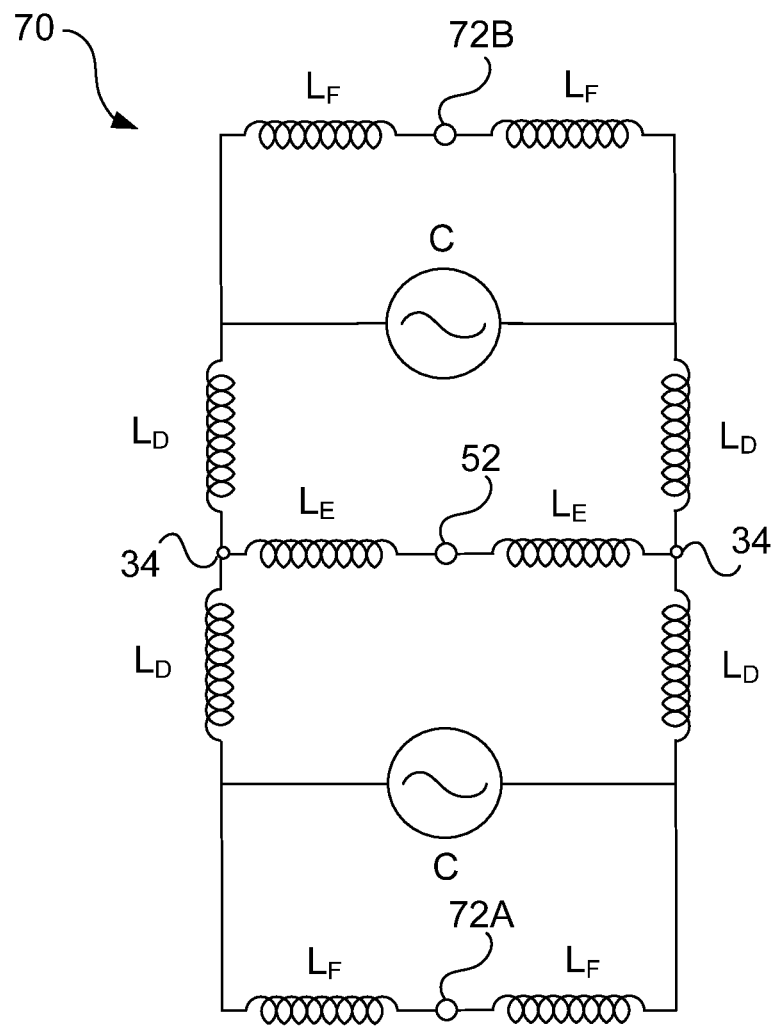
FIG. 8 shows an equivalent electrical circuit representation of the oscillator according to the embodiment of the invention illustrated in FIG. 7.

FIG. 8 shows an equivalent electrical circuit representation of the oscillator 70 according to the embodiment of the invention illustrated in FIG. 7. The inductor element 31 is here represented by the inductors $L_D$ and the first and second capacitive circuits 32A, 32B are represented by variable capacitors C. The inductor element interconnect 51 is here represented by the inductors $L_E$ and the second and third inductor elements 71A, 71B is here represented by the inductors $L_F$. The in-phase virtual ground point 52 and the virtual ground points 72A, 72B for the second and third inductor elements 71A, 71B are also shown. The inductor value of inductors $L_D$ is half of the inductor value of the inductor L shown in FIG. 2, that is, $L_D=L_B=L_A=L/2$. The inductor values of the inductors $L_E$ and the inductors $L_F$ are implementation specific and may be chosen in relation to the inductors $L_D$. In reference to the general illustrative example, the inductor value of the inductors $L_E$ may be selected to $L_E \approx 0.4 \cdot L_D$ (such as $L_C$ in FIG. 6) and the inductor value of the inductors $L_F$ may be selected to $L_F \approx 1.4 \cdot L_D$.

In the out-of-phase mode, no current will, in general, flow through the inductors $L_E$ since the inductor element interconnect 51 is not utilized in this mode and hence may be considered virtual ground. The directions of the currents in the oscillator 70 as the resonance circuits are supplied with power can be identical to that described above in relation to FIG. 4 and shown by the fully drawn and dashed arrows in FIG. 4. However, in the out-of-phase mode, as a current can additionally flow from a first one of the variable capacitors C through one of the inductors $L_F$ on the right side of the electrical circuit, a current can simultaneously flow from the second one of the variable capacitors C through one of the inductors $L_F$ on the left side of the electrical circuit. The currents may flow past the virtual ground points 72A, 72B, respectively, and through a second one of the inductors $L_F$ and towards the variable capacitors C. The inherent properties of the resonance circuits may then cause the direction of the currents to swing, whereby the currents may flow back in the opposite direction through the second one of the inductors $L_F$, past the virtual ground points 72A, 72B, respectively, and through the inductors $L_F$ on the right and left side, respectively, of the electrical circuit and back to the variable capacitors C. This illustrates the out-of-phase oscillation of the variable capacitors C, i.e. the first and second capacitive circuits 32A, 32B in FIG. 7, feeding opposite sides of the electrical circuit at the same time in the oscillator 70. The single ended inductance as seen by the variable capacitors C can be $L_D \| L_F$, i.e. $L_D$ coupled in parallel with $L_F$. It follows, in reference to the general illustrative example, that the single ended inductance as seen by the variable capacitors C can be $L_D \| L_F = L_D \| 1.4 \cdot L_D = 100 \| 140 \approx 58$ pH.

In the in-phase mode, the directions of the current in the oscillator 70 as the resonance circuits are supplied with power can be identical to that described by the in-phase mode above in relation to FIG. 6 and shown by the fully drawn and dashed arrows in FIG. 6. Simultaneously, current can additionally flow from the variable capacitors C through a first one of the inductors $L_F$ on right side of the electrical circuit towards past the virtual ground points 72A, 72B, respectively, through a second one of the inductors $L_F$ on the left side of the electrical circuit and back towards the variable capacitor C. As the inherent properties of the resonance circuits causes the direction of the current to swing, current may flow back in the opposite direction through the second one of the inductors $L_F$ on the left side of the electrical circuit, past the virtual ground points 72A, 72B, respectively, and through the first one of the inductors $L_F$ back to the variable capacitors C. This illustrates the in-phase oscillation of the variable capacitors C, i.e. the first and second capacitive circuits 32A, 32B in FIG. 7, feeding the same sides of the electrical circuit at the same time in the oscillator 70. The single ended inductance as seen by the variable capacitors C may be $(L_D+2 \cdot L_E) \| L_F$, i.e. $(L_D+2 \cdot L_E)$ coupled in parallel with $L_F$. It follows, in reference to the general illustrative example, that the single ended inductance as seen by the variable capacitors C may be $(L_D+2 \cdot L_E) \| L_F = (L_D+2 \cdot 0.4 \cdot L_D) \| 1.4 \cdot L_D = (L_D+0.8 \cdot L_D) \| 1.4 \cdot L_D = 1.8 \cdot L_D \| 1.4 \cdot L_D = 180 \| 140 \approx 79$ pH.

The description above is of the best mode presently contemplated for practising the invention. The description is not intended to be taken in a limiting sense, but is made merely for the purpose of describing the general principles of the invention. The scope of the invention should only be ascertained with reference to the issued claims.

The invention claimed is:

1. An oscillator for use in generating frequencies in a frequency synthesizer, said oscillator comprising:
   a first inductor element forming a metal trace loop with at least one turn;
   a first capacitive circuit arranged to form a first resonance circuit with the first inductor element and being connected to the first inductor element through at least one first connection terminal, wherein the first capacitive circuit comprises at least one capacitive element and an electrical components arrangement configured to establish and maintain an oscillation;
   a second capacitive circuit comprising at least one capacitive element and an arrangement of electrical components, said second capacitive circuit configured to form a second resonance circuit with the first inductor element and connected to the first inductor element through at least one second connection terminal located on the opposite side of the first inductor element with respect to the first connection terminal of the first capacitive circuit; and
   wherein the first and second resonance circuits are tuned to substantially the same frequency.

2. The oscillator of claim 1, further comprising:
   an inductor element interconnect providing a electrical connection between a first point on a first side of the first inductor element located between the first and second capacitive circuit with a second point on the other side of the first inductor element located between the first and second capacitive circuit; and
   wherein the first and second points of the first inductor element are located at an substantially equal distance from both the first and second capacitive circuit.

3. The oscillator of claim 2, further comprising:
   a second inductor element forming a metal trace loop with at least one turn and being connected to the first capacitive circuit in parallel with the first inductor element; and
   a third inductor element forming a metal trace loop with at least one turn and being connected to the second capacitive circuit in parallel with the first inductor element.

4. The oscillator of claim 3, wherein the first inductor element, the first capacitive circuit, the second capacitive circuit, the inductor element interconnect, and at least one of the second and third inductor elements are formed as an integrated circuit and are integrated on the same die.

5. The oscillator of claim 1, wherein the first resonance circuit and second resonance circuit are phase locked to oscillate out-of-phase.

6. The oscillator of claim 1, wherein the first resonance circuit and second resonance circuit are phase locked to oscillate either in-phase or out-of-phase.

7. The oscillator of claim 6, wherein the amount of variable capacitance in the first and second capacitive circuit is based on the desired frequency ranges relating to the two resonance frequencies of the in-phase mode and out-of-phase mode of the first and second resonance circuit.

8. The oscillator of claim 1, wherein the capacitances of the first and second capacitive circuits are configured to be dynamically controlled.

9. A frequency synthesizer comprising:
a phase-locked loop (PLL) for generating frequencies; and
an oscillator comprising:
   a first inductor element forming a metal trace loop with at least one turn;
   a first capacitive circuit arranged to form a first resonance circuit with the first inductor element and being connected to the first inductor element through at least one first connection terminal, wherein the first capacitive circuit comprises at least one capacitive element and an electrical components arrangement configured to establish and maintain an oscillation;
   a second capacitive circuit comprising at least one capacitive element and an arrangement of electrical components, said second capacitive circuit configured to form a second resonance circuit with the first inductor element and connected to the first inductor element through at least one second connection terminal located on the opposite side of the first inductor element with respect to the first connection terminal of the first capacitive circuit; and
   wherein the first and second resonance circuits are tuned to substantially the same frequency.

10. The frequency synthesizer of claim 9, wherein the PLL and the oscillator are integrated on the same die so as to form an integrated, single chip frequency synthesizer.

11. The frequency synthesizer of claim 9, wherein the frequency synthesizer comprises part of a network node that is configured use in a telecommunications network.

12. The frequency synthesizer of claim 11, wherein the network node is a base station and the frequency synthesizer is configured for operation therein.

* * * * *